(12) United States Patent
Lindemann et al.

(10) Patent No.: US 10,225,654 B1
(45) Date of Patent: Mar. 5, 2019

(54) SPEAKER DISTORTION REDUCTION

(71) Applicant: Cirrus Logic International Semiconductor Ltd., Edinburgh (GB)

(72) Inventors: Eric Lindemann, Boulder, CO (US); Ziad Hatab, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/698,142

(22) Filed: Sep. 7, 2017

(51) Int. Cl.
*H04R 3/04* (2006.01)
*H04R 3/00* (2006.01)
*H03G 3/00* (2006.01)

(52) U.S. Cl.
CPC ............... *H04R 3/04* (2013.01); *H03G 3/001* (2013.01); *H04R 3/007* (2013.01); *H04R 2430/01* (2013.01)

(58) Field of Classification Search
CPC ...... H04R 3/04; H04R 3/007; H04R 2430/01; H03G 3/001
USPC .......................................... 381/94.1–94.3, 55
See application file for complete search history.

(56) References Cited

U.S. PATENT DOCUMENTS

| | | | |
|---|---|---|---|
| 5,737,432 A * | 4/1998 | Werrbach ............... | H03G 9/025 381/100 |
| 2011/0044471 A1 * | 2/2011 | Aarts ....................... | H04R 3/04 381/98 |
| 2013/0142360 A1 * | 6/2013 | Potard ....................... | H03G 9/18 381/98 |
| 2014/0321668 A1 * | 10/2014 | Kimura ..................... | H04R 3/04 381/101 |
| 2015/0304775 A1 * | 10/2015 | Fujita ...................... | H04R 3/04 381/94.2 |
| 2016/0173983 A1 | 6/2016 | Berthelsen et al. | |
| 2017/0011748 A1 | 1/2017 | Porter et al. | |

FOREIGN PATENT DOCUMENTS

| | | |
|---|---|---|
| EP | 2334103 A2 | 6/2011 |
| GB | 2497429 A | 6/2013 |
| WO | 2014179021 A1 | 11/2014 |

* cited by examiner

*Primary Examiner* — David Ton
(74) *Attorney, Agent, or Firm* — Norton Rose Fulbright US LLP

(57) ABSTRACT

A spectral tilt of an audio signal is used to determine whether a speaker will introduce perceptible distortion during playback of the audio signal. The spectral tilt may be indicated by determining a ratio between energy in a distortion-producing frequency band and energy in a distortion-masking frequency band. Based on the determined spectral tilt, the distortion-producing frequency band may be attenuated to reduce the distortion introduced by the speaker. Additionally, the distortion-masking frequency band may be amplified to reduce perceptibility of the distortion produced by the speaker.

33 Claims, 8 Drawing Sheets

SPEAKER DISTORTION REDUCTION

CROSS-REFERENCE TO RELATED PATENT APPLICATIONS

This application is related by subject matter to U.S. patent application Ser. No. 15/698,193 entitled "Transient Detection for Speaker Distortion Reduction" and filed on Sep. 7, 2017, which is incorporated by reference.

FIELD OF THE DISCLOSURE

The instant disclosure relates to audio processing. More specifically, portions of this disclosure relate to audio processing to compensate for speaker distortion.

BACKGROUND

Speakers are not capable of perfectly replicating sounds encoded in audio files. Trade-offs are made during speaker design and manufacturing to fit particular applications. For example, cost constraints may result in selection of materials for speakers that are not ideal. As another example, space constraints may result in construction of a speaker with a size that is not ideal for reproduction of all frequencies of sounds. Smaller speakers, such as those used in mobile phones, are generally less accurate with reproduction of sounds and can introduce distortion into the reproduced sounds. Furthermore, manufacturing imperfections in smaller speakers can introduce additional distortion into the reproduced sounds.

Shortcomings mentioned here are only representative and are included simply to highlight that a need exists for improved electrical components, particularly for speakers employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

SUMMARY

Distortions introduced by a speaker may be reduced by processing an audio signal to modify the audio content and outputting the modified audio signal to the speaker for reproduction. Problematic sounds in the audio signal may be modified to reduce the impact of speaker distortions on the reproduced sounds. One example of a problematic sound results from small leaks at the edge of a micro-speaker diaphragm. As compressed air in the speaker enclosure pushes against the diaphragm, these leaks may result in high frequency noise or distortion as air escapes from the mechanism. One way to mitigate this problem is to attenuate the signal level so that there is less air pressure It is desirable to attenuate the input signal only when there is evidence that input signal is prone to producing audible distortion. Those sounds that are prone to producing audible distortion should be attenuated. All other sounds should be left unmodified. Other sounds that when reproduced have little or no perceived distortion may be output for reproduction without modification. Sounds may be determined to be prone to audible distortion based upon a signal level in a distortion-producing frequency band and a signal level in a distortion-masking frequency band. When the distortion-producing frequency band signal level is high, this may cause audible distortion in the distortion-masking frequency band. For example, the distortion-producing frequency band may be in the 200 Hz-1400 Hz range. A high signal level in this frequency range may result in mechanical leaks causing high frequency whistling sounds in the distortion-masking frequency band—e.g. 1500 Hz to 20 kHz. If there is insufficient signal level from the original input signal in the distortion-masking frequency band to mask the whistling sounds, then the user may perceive the whistling sounds as audio distortions. When this occurs, the audio in an attenuation frequency band may be reduced to prevent the whistling or distortion from occurring. The attenuation frequency band may be the same as the distortion-producing frequency band—e.g. 200 Hz to 1400 Hz. Or the attenuation frequency band may be wider or narrower than the distortion-producing frequency band. For example, the attenuation frequency band may span the entire audio range from 0 Hz to 22 kHz.

In summary, strong low frequencies in the distortion-producing frequency band that increase air pressure in a micro-speaker may result in leaks that create high frequency noise or distortion in the distortion-masking frequency band. If the original input sounds also include sufficient high frequencies in the distortion-masking frequency band, these original input high frequencies can mask the high frequency distortion products resulting from the original input low frequencies. While the high frequency noise in the distortion-masking frequency band is still present, it is less audible due to masking by the high frequencies of the original input. If the original input lacks sufficient high frequencies in the distortion-masking frequency band, then any high frequency noise or distortion products resulting from loud input low frequencies will be exposed and more audible. Thus, audio signals with little content in the high frequencies but substantial low frequencies may have more noticeable high frequency distortion.

In addition to attenuating the signal in the attenuation frequency band, it is also possible to boost the input signal in the distortion-masking frequency band—e.g. 1500 Hz to 20 kHz—so that there is increased masking of the undesirable distortion sounds.

One manner of expressing the distortion-producing and distortion-masking characteristics of the audio signal is spectral tilt. Spectral tilt refers to how energy is distributed across the spectrum in the audio signal. The spectrum of an audio signal with loud low frequency content and little high frequency content has a downward spectral tilt. An input audio signal with a pronounced downward spectral tilt and a reasonably high input level in low frequencies will be prone to cause noticeable distortion in the distortion masking-frequency band. Because of the downward spectral tilt of the input audio signal, there will be little high frequency energy to mask the distortion products. Therefore, a spectral tilt measure together with a low frequency or wideband signal level estimate can provide the information necessary to determine if the level of the attenuation frequency band should be reduced. There are many methods known to those skilled in the art for producing spectral tilt estimates.

In addition to spectral tilt, another method for determining whether the attenuation frequency band should be reduced is to compute the ratio of power between the distortion-masking frequency band and the distortion-producing frequency band. This is the DM2DP ratio. If the DM2DP ratio is low and the level in the distortion-producing frequency band is high, then the level in attenuation frequency band should be reduced. Another interpretation is that the DM2DP ratio is itself a crude spectral tilt measure. One embodiment of a system for reducing the level in the attenuation frequency band uses an audio signal limiter. The limiter includes a limiter threshold. When the input signal is below the limiter threshold, it is unmodified. As the signal level approaches the limiter threshold, it is gradually attenuated. When the signal level is above the limiter threshold, the signal level is reduced so that the level stays at the limiter threshold. In this embodiment of the present disclosure, the limiter threshold is variable. It is set as a function of the DM2DP ratio or the spectral tilt estimate. When the DM2DP ratio is high or when there is little downward spectral tilt, then the limiter ratio is maintained at full scale. So, any input signal level passes through the limiter unmodified. As the DM2DP ratio is reduced, or as the spectral tilt becomes more downward, the limiter threshold is reduced proportionally. Any input signal levels that are above this reduced limiter threshold will be then attenuated. The result then is a limiter that only limits signals with a low DM2DP ratio or with a downward spectral tilt. Thus, sounds that are prone to audible distortion may be processed by limiting prior to reproduction to prevent undesirable audible distortion.

The limiter can work from the entire audio frequency spectrum—i.e. a wideband limiter—or it can work over a selected frequency band—i.e. a narrowband limiter. In this embodiment, the frequency band of the limiter is the attenuation frequency band, which may include just the distortion-producing frequency band or may include the entire audio frequency band or some other part of the audio frequency band.

One example method for reducing perceived audio distortion in a loudspeaker in response to an input audio signal may include determining a first signal level of a distortion-producing frequency band of the input audio signal; determining a second signal level of a distortion-masking frequency band of the input audio signal; and attenuating the signal level in an attenuation frequency band of the input audio signal to produce a modified audio signal based, at least in part, on the signal level of the distortion-producing frequency band and on the signal level of the distortion-masking frequency band.

Another example method for processing an input audio signal to implement selective narrow band limiting may include determining a level of spectral tilt in the audio signal and modifying the input audio signal to produce a modified audio signal that reduces distortion introduced by a speaker. Determining the level of spectral tilt may be performed by determining and comparing several signal levels. A first signal level in a distortion-producing frequency band of the input audio signal may be determined. The distortion-producing frequency band may be centered at a resonant frequency of the speaker, at which distortion is introduced by the speaker due to the high signal levels occurring at resonance. The resonant frequency of a micro-speaker for a mobile phone is between 300 Hertz and 1500 Hertz. A second signal level in a distortion-masking frequency band of the input audio signal may be determined. The distortion-masking frequency band may be at a higher frequency range than the distortion-producing frequency band. For example, the distortion-masking frequency band may be from 1500 Hertz to 20000 Hertz.

Based on an evaluation of these two signal levels, narrow band limiting may be selectively applied. For example, a ratio of the second signal level to the first signal level may be used to establish a distortion-masking ratio (DM2DP ratio) indicating the spectral tilt as a ratio of distortion-masking energy to distortion-producing energy. The distortion-masking ratio can then be used to set the limiter threshold of a narrow band limiter applied to the distortion-producing frequency band. The lower the DM2DP ratio is, the lower the limiter threshold is. If the input signal then exceeds the limiter threshold, the input signal in the attenuation frequency band is reduced. The final attenuation of the input signal is the result of the DM2DP ratio and the input signal level. In some embodiments, the attenuation may be the same as the distortion-producing frequency bands. In other embodiments, the attenuation frequency band may be wider and include sounds outside the distortion-producing frequency band. For example, the distortion-producing frequency band may be substantially limited to low frequencies, but the attenuation frequency band may include both low frequencies and high frequencies.

The attenuation may limit a dynamic range of the input audio signal within the attenuation frequency band using a limiter threshold level. The attenuation may be performed by processing the audio to compare the signal level in the distortion-producing frequency band to a limiter threshold level. When the signal level in the distortion-producing frequency band is above the limiter threshold level, the signal level in the attenuation frequency band is attenuated. When the signal level in the distortion-producing frequency band is below the limiter threshold level, the signal level in the attenuation frequency band is left substantially unattenuated or unchanged. The level of attenuation may be adjusted by adjusting the limiter threshold level based, at least in part, on a ratio of the signal level in the distortion-masking frequency band to the signal level in the distortion-producing frequency band—i.e. the DM2DP ratio. For example, the limiter threshold may be reduced proportionally to a decrease of the DM2DP ratio.

The modified audio signal produced according to the signal processing described herein may be output to a speaker for reproduction. For example, a music file may be processed as an audio signal to obtain a modified audio signal that is played back through a speaker of a mobile phone for a user. As another example, a streaming video may include sounds that are processed as an audio signal to obtain a modified audio signal that is played back through a speaker of a mobile phone for a user. The audio processing may be performed by an integrated circuit, such as an audio controller of a smart phone. The audio controller may be a separate component in the smart phone or the audio controller may be integrated with other components, such as with a processor in a system on chip (SoC), in the smart phone.

Electronic devices incorporating the audio processing described above may benefit from improved audio quality played back through a speaker. For example, a mobile phone user may experience higher quality playback by reducing audible distortions introduced by the microspeaker. Selectively applying the processing based on a determination of the audio content, such as by evaluating the spectral tilt or DM2DP ratio, improves playback of sounds that cause distortion in the speaker without affecting sounds that do not cause distortion in the speaker. For example, solo piano music may have a pronounced downward spectral tilt with high low frequency levels and little high frequency energy. Attenuation may be applied to this audio content to reduce audible distortion introduced by the microspeaker. In contrast, pop music may have a flatter spectral tilt and little or no attenuation may be applied to this audio content.

Integrated circuits for performing the audio processing may include an analog-to-digital converter (ADC). The ADC may be used to convert an analog signal, such as an audio signal, to a digital representation of the analog signal. Additionally or alternatively, the integrated circuit may include a digital-to-analog converter (DAC). The DAC may receive an audio signal for playback, such as audio received from a digital music file or audio streamed over a wireless network. In some embodiments, the audio processing may be performed on the digital signal prior to input to the DAC, and the DAC converts the modified audio signal to an analog signal for amplification to drive a speaker. In some embodiments, the audio processing may be performed on an analog signal output from the DAC. The digital audio is output to the DAC for conversion to an analog signal, which is processed in the analog domain, and then the modified analog audio signal is amplified and used to drive a speaker. Integrated circuits with the audio processing functionality described herein may be used in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
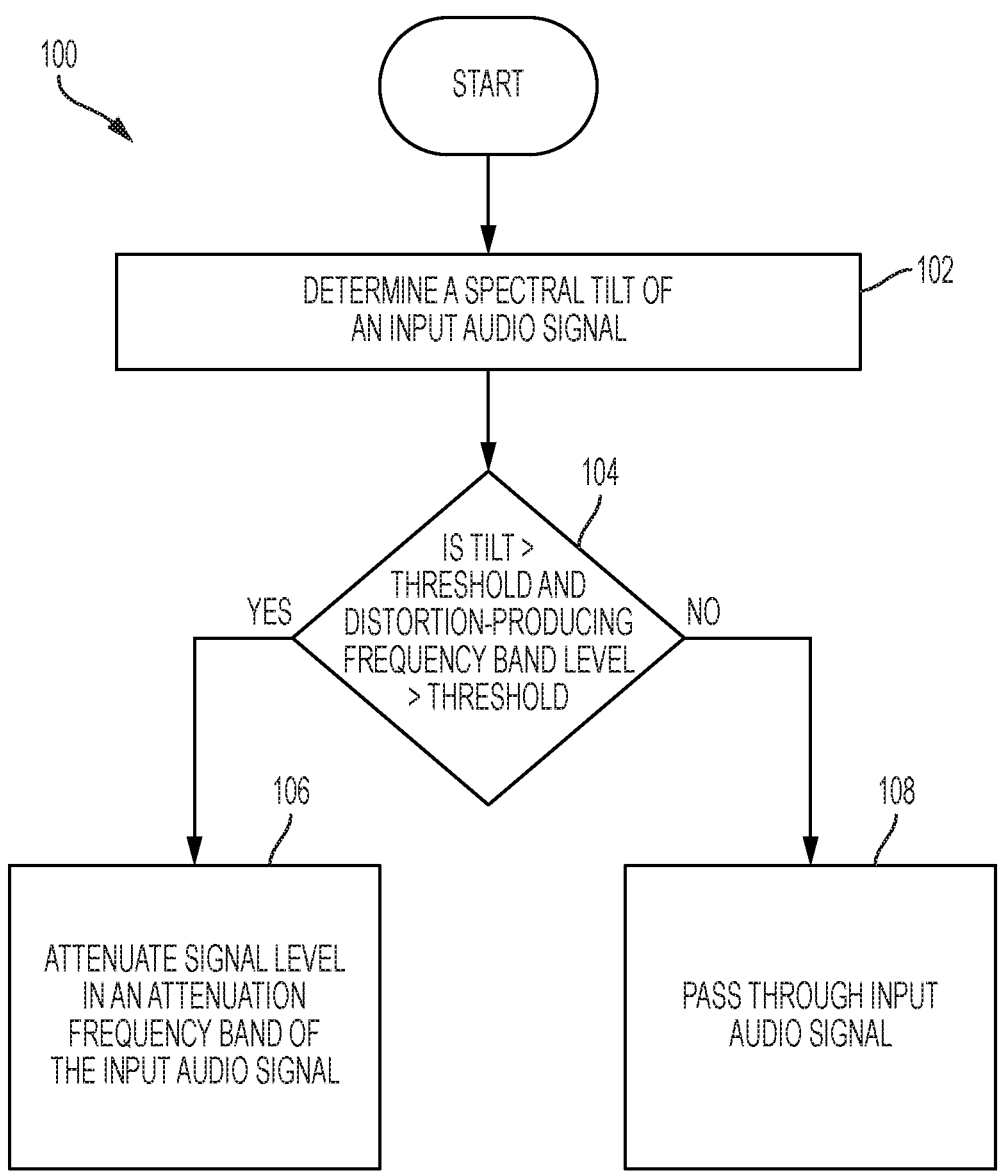
FIG. 1 is a flow chart illustrating an example method of processing an input audio signal to reduce audible distortion according to some embodiments of the disclosure.

FIG. 1 is a flow chart illustrating an example method of processing an input audio signal to reduce distortion according to some embodiments of the disclosure. A method 100 begins at block 102 with determining a spectral tilt value for an input audio signal. The spectral tilt of the input audio signal may be representative of a ratio between a signal level of a distortion-producing frequency band of the input audio signal and a signal level of a distortion-masking frequency band of the input audio signal. One method of computing a spectral tilt value is to compute the ratio of a first signal level of the distortion-producing frequency band to a second signal level of the distortion-masking frequency band. For example, a ratio of the second signal level to the first signal level may be determined. Another method of computing a spectral tilt value is to compute the ratio of a first signal level of the distortion-producing frequency band with a second signal level indicative of the signal level in the entire audio signal or in an audible subset of the audio signal. Yet another method of computing a spectral tilt value is to fit a line to a distribution of energy across audible frequencies and use the slope of that line as the spectral tilt value. Many methods for computing spectral tilt estimates are known to those skilled in the art of audio signal processing.

The spectral tilt value is used, in conjunction with the input audio signal level, or the level of the input signal in the distortion producing frequency band of the input audio signal, to determine whether to apply attenuation to the input audio signal to reduce audible distortion resulting from reproduction of the input audio signal. At block 104, the spectral tilt value may be compared to a threshold value and the energy level of a distortion-producing frequency band compared to a threshold value to determine whether perceptible audio distortion is not sufficiently masked. If both are larger than the threshold value, then the method 100 continues to block 106. At block 106, a portion of the input audio signal is attenuated to create a modified audio signal for driving a speaker. If not, then the method 100 continues to block 108. At block 108, the input audio signal is passed through to drive the speaker with little or no modification.

Figure 2A:
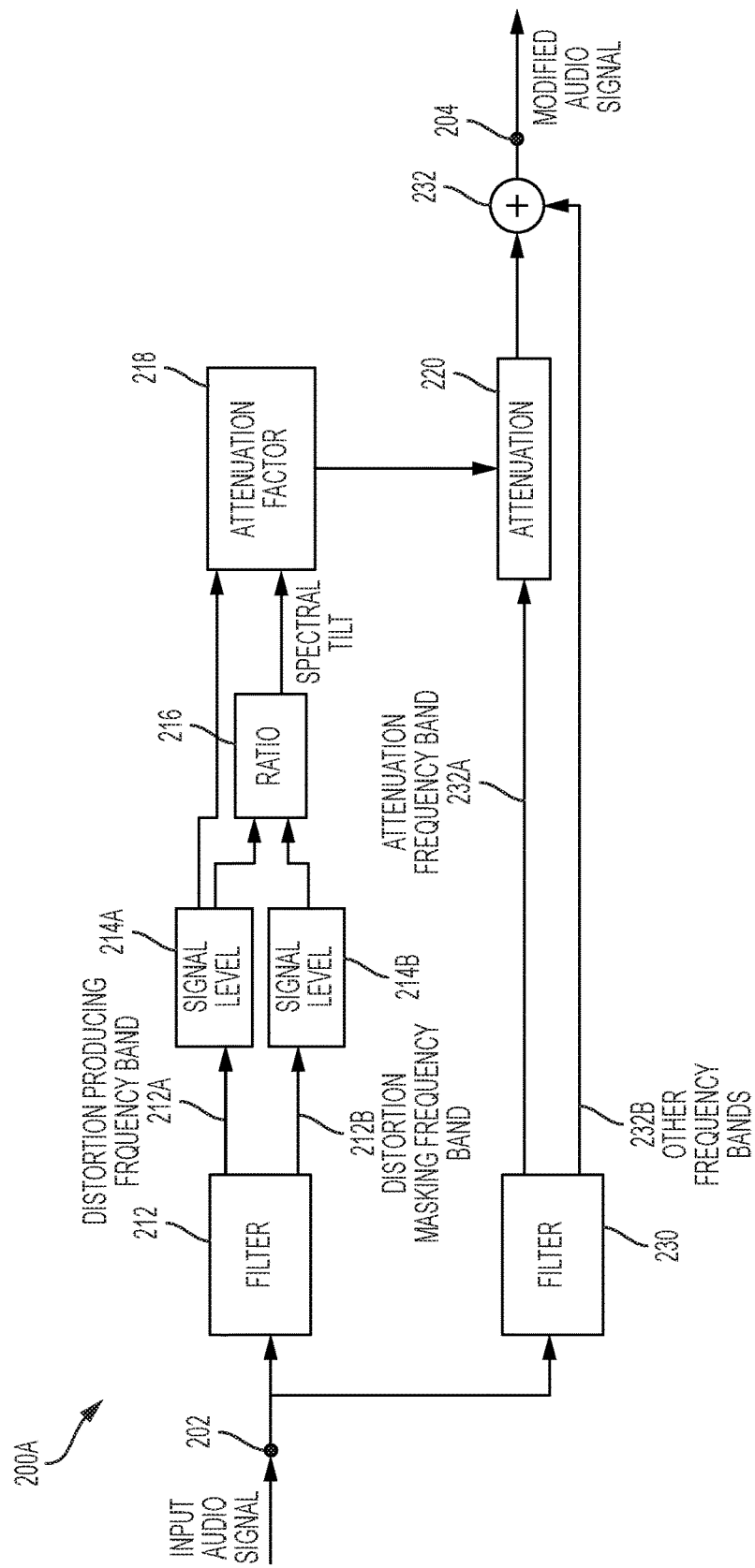
FIG. 2A is a block diagram for an example integrated circuit for processing an input audio signal to reduce distortion according to some embodiments of the disclosure.

A block diagram for an integrated circuit for implementing the method illustrated in FIG. 1 is shown in FIG. 2A. FIG. 2A is a block diagram for an example integrated circuit for processing an input audio signal to reduce distortion according to some embodiments of the disclosure. A person of ordinary skill in the art can implement the block diagram of FIG. 2A in an integrated circuit, such as by programming a digital signal processor (DSP) or a central processing unit (CPU) or designing an application-specific integrated circuit (ASIC), to perform the functions described with reference to FIG. 2A. An IC 200A receives an input audio signal at input node 202. The input audio signal may be filtered at filter block 212 to produce separate audio signals for distortion-producing frequency band 212A and distortion-masking frequency band 212B. Signal levels of the bands 212A and 212B are determined by signal level blocks 214A and 214B. A ratio of the signal levels output from blocks 214A and 214B is computed at ratio block 216. That ratio is a value representative of the spectral tilt of the input audio signal.

The spectral tilt value and the signal level of the distortion producing frequency band output from ratio block 216 are used by attenuation factor block 218 to determine an amount to attenuate a signal level of portions of the input audio signal The attenuation may be applied to all or part of the input audio signal to produce a modified audio signal for output at output node 204. A filter 230 receives the input audio signal from input node 202 and produces an audio signal 232A with the attenuation frequency band and an audio signal 232B with other frequency bands. An attenuation block 220 applies the determined attenuation from block 218 to the audio signal 232A with the attenuation frequency band. Combiner 232 combines the output of the attenuation factor block 218 with the audio signal 232B with the other frequency bands to produce a modified audio signal at output node 204. The modified audio signal produces less audible distortion when played back through a speaker The frequency bands may be selected based on characteristics of the speaker reproducing the audio signal. The distortion-producing frequency band may be selected to align with frequency bands that are naturally at high levels in a particular speaker. For example, signal levels may be particularly high at the resonance frequency of the speaker. For a microspeaker, the resonant frequency may be between approximately 300 Hertz and 1500 Hertz. These high levels may produce distortion in the distortion-masking frequency band, which may be at a higher frequency—e.g., 1500 Hz to 20000 Hz. The distortion-masking frequency band may include sounds that when played have a psychoacoustic effect of covering the distortion from perception by a listener. In some embodiments, the distortion-producing frequency band may be the entire audible spectrum and the distortion-masking frequency band may be a subset of the audible spectrum.

Attenuation may be used to reduce the signal level of sounds in an attenuation frequency band in order to reduce distortion in the distortion-masking frequency band. For example, attenuation may be applied when the measured signal level in the distortion producing frequency band of the input audio signal is high enough to generate noticeable distortion products in the distortion-masking frequency band, and the measured signal level in said distortion-masking frequency band of the input audio signal is insufficient to substantially mask said distortion products. The attenuation frequency band may be selected such that a distortion introduced by the speaker is reduced proportionally when the signal level in the frequency band is reduced. In some embodiments, the attenuation frequency band may overlap with the distortion-producing frequency band such that some or all of the energy in the distortion-producing frequency band is reduced.

Figure 2B:
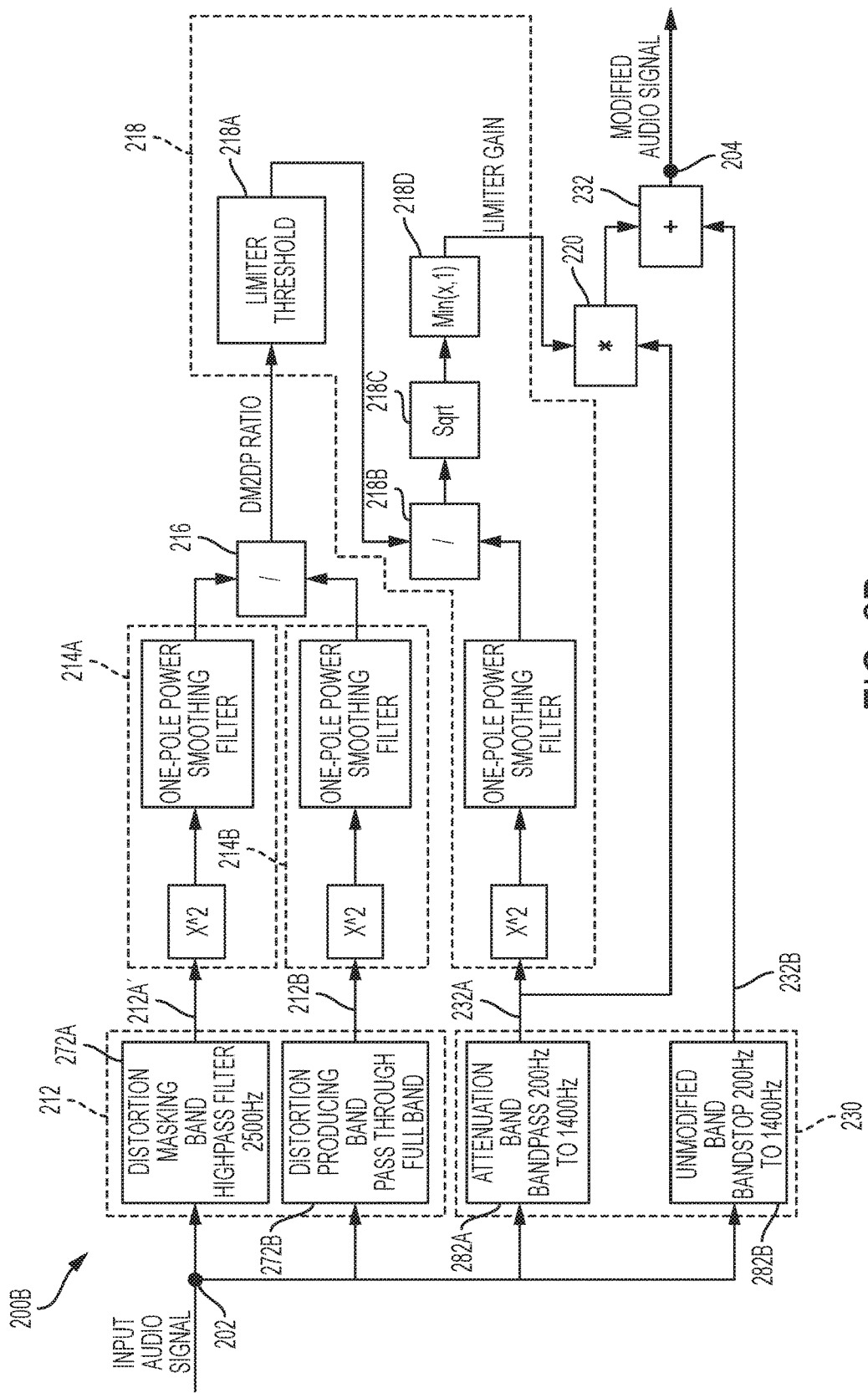
FIG. 2B is a block diagram for an example integrated circuit for processing an input audio signal to reduce distortion according to some embodiments of the disclosure.

FIG. 2B shows another embodiment of the disclosure. High-pass filter 212A isolates the frequency band above 2500 Hz, which is the distortion-masking frequency band for this embodiment. Block 272B passes through the entire input signal because the entire frequency band is the distortion producing frequency band in this embodiment. Bandpass filter 282A passes the frequency band from 200 Hz to 1400 Hz, which is the attenuation frequency band for this embodiment. Bandpass filter 282B passes all parts of the audio signal that are not part of the attenuation band. The signal power levels of the distortion masking frequency band, the distortion producing frequency band, and the attenuation frequency band are calculated by computing the squared signal values in $x^2$ blocks of 214A, 214B, and 218. These squared signal values are smoothed using the one-pole filters of the same blocks to produce smoothed power estimates of the three frequency band signals. The distortion-masking-to-distortion-producing power ratio (DM2DP ratio) is computed by dividing the distortion-masking frequency band power by the distortion-producing frequency band power in 218B. The DM2DP power ratio is scaled and offset inside block 218A to produce a limiter threshold. In block 218B, the limiter threshold is divided by the smoothed power level of the attenuation frequency band. The square root operation of block 218C converts this ratio into a potential limiter gain value. The output of block 218C will be greater than one if the limiter threshold is greater than the smoothed power level of the attenuation band signal output from 212A. In this case, rather than amplify the signal, the signal is passed unchanged. Thus, in block 218D, the gain is the limited maximum of 1. If the output of block 218C is less than one, then the output passes through block 218D unchanged; if it is greater or equal, to one then it is set to one by block 218D. When the signal level of the attenuation frequency band is greater than the limiter threshold, the limiter gain output from block 218D will be less than one, otherwise the limiter gain will be exactly one. In block 220, the attenuation band signal is multiplied by the limiter gain. The result is that when the attenuation band signal is above the limiter threshold, it is attenuated; otherwise it passes unchanged through block 220 due to the multiply-by-one. The newly-limited attenuation band is then added to the output of the band-stop filter of 282B. The output of filter 282B represents all of the signal that is not part of the attenuation band, which should pass through the system unmodified. The output of the adder block 232 is the modified audio output of the system, which includes the limited attenuation band. Although certain computations and frequency ranges are illustrated in the embodiment of FIG. 2B, other embodiments may perform different calculations and different frequency ranges for attenuating a portion of the input audio signal to reduce speaker distortion.

Figure 3:
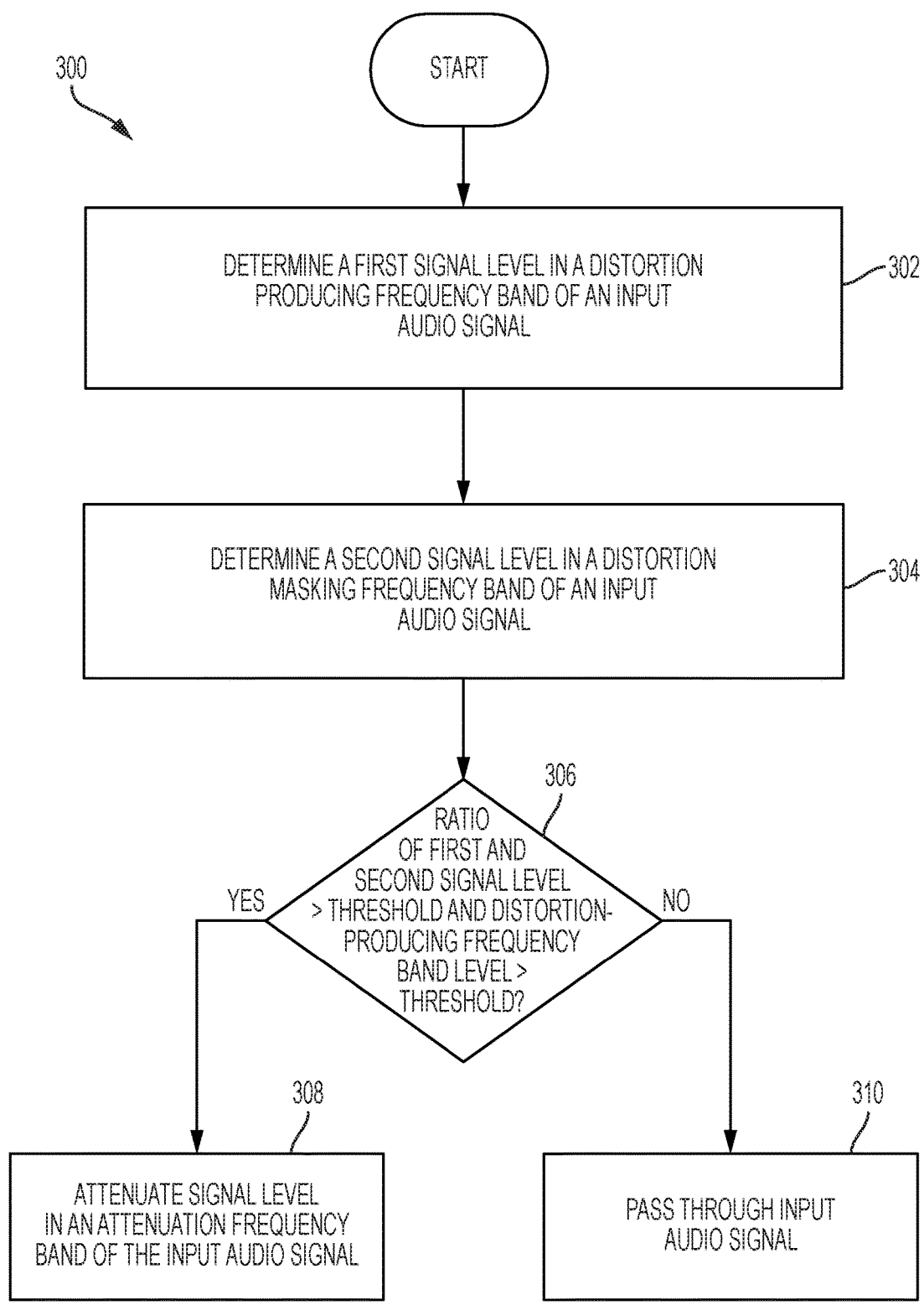
FIG. 3 is a flow chart illustrating another example method of processing an input audio signal to reduce distortion according to some embodiments of the disclosure.

Spectral tilt may be evaluated using various metrics. For example, one example of spectral tilt value is determined in the integrated circuits of FIG. 2A and FIG. 2B. That spectral tilt value may be a ratio of a first signal level of a distortion-masking frequency band to a second signal level of a distortion-producing frequency band, referred to as a DM2DP ratio. A method for modifying an audio signal using this ratio is shown in FIG. 3. FIG. 3 is a flow chart illustrating another example method of processing an input audio signal to reduce distortion according to some embodiments of the disclosure. A method 300 begins at block 302 with determining a first signal level in a distortion-producing frequency band of an input audio signal. At block 304, a second signal level is determined for a distortion-masking frequency band of the input audio signal. At block 306, a ratio of the first and second signal levels is compared with a threshold level and a level of the distortion-producing frequency band compared with a threshold level. If both are higher than their respective thresholds, then the method 300 continues to block 308 to attenuate a signal level in an attenuation frequency band of the input audio signal. If not, then the method 300 continues to block 310 to pass the input audio signal through without any attenuation.

Another example spectral tilt value may be based on a percentage of audio energy in a high-frequency band as a percentage of all audio energy in the input audio signal. This ratio may be expressed as a ratio of a first signal level of a subset of frequencies of the input audio signal and a second signal level of the entire input audio signal. The subset of frequencies may be higher in frequency than the distortion-producing frequency band. The high frequency content selected for determining the ratio may have some effect in masking distortion introduced by the speaker in the distortion-producing frequency bands of the input audio signal. An example integrated circuit for performing attenuation based on this evaluation of spectral tilt is shown in FIG. 4.

Figure 4:
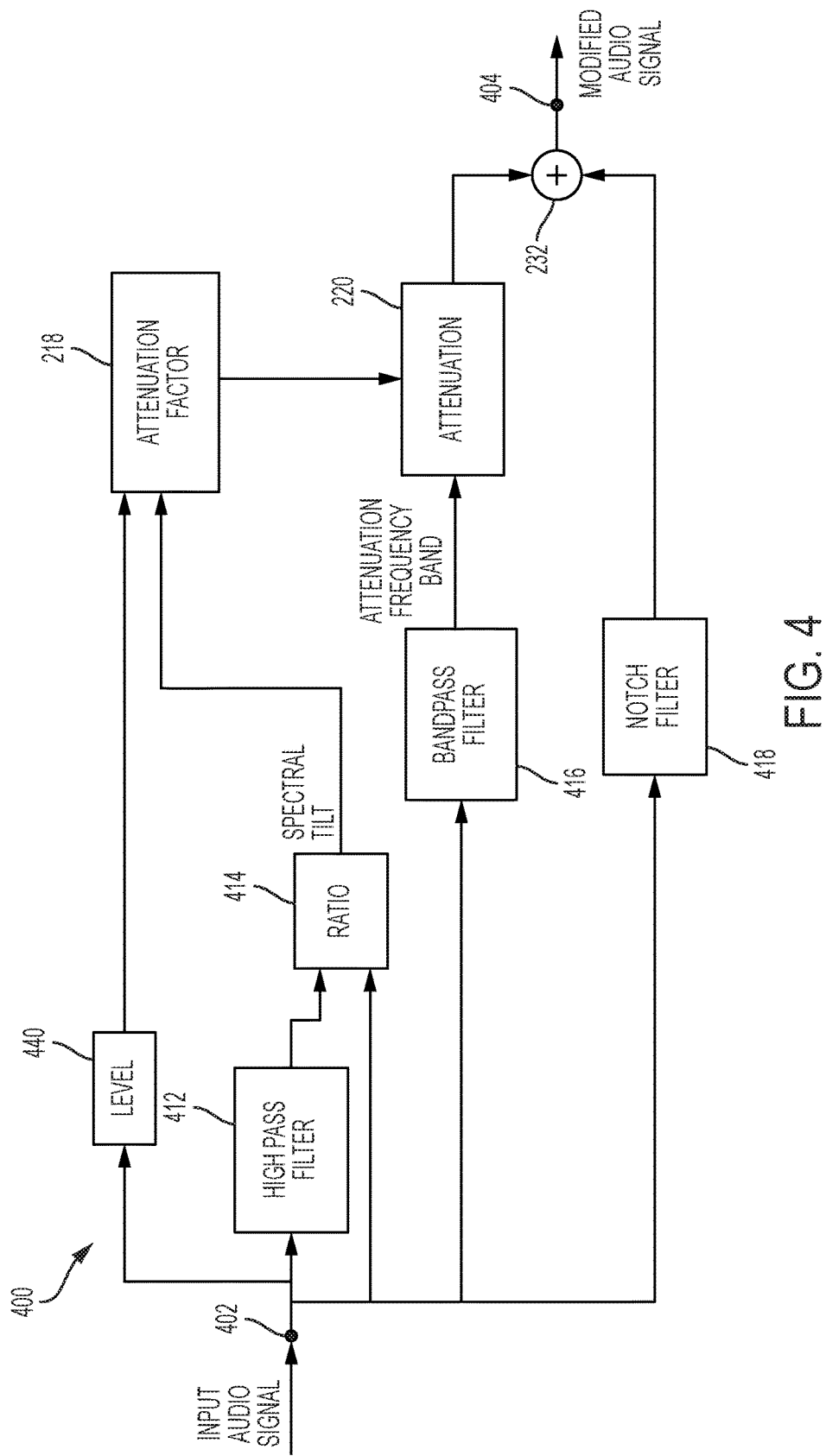
FIG. 4 is a block diagram for another example integrated circuit for processing an input audio signal to reduce distortion according to some embodiments of the disclosure.

FIG. 4 is a block diagram for another example integrated circuit for processing an input audio signal to reduce distortion according to some embodiments of the disclosure. An integrated circuit (IC) 400 receives an input audio signal at input node 402. The input signal is high-pass filtered in filter block 412. The cut-off for the high-pass filter block 412 is chosen to select high-frequency content that may have some effect in masking distortion introduced by the speaker in the distortion-producing frequency bands of the input audio signal. One example cut-off is 2.5 kilohertz. Ratio block 414 compares a signal level of the high-pass filtered audio signal with the input audio signal to evaluate a spectral tilt value. The spectral tilt value is provided to attenuation factor block 218. The attenuation factor block 218 determines parameters, such as a limiter threshold, for attenuating portions of the input audio signal, based on a spectral tilt and an energy level of the distortion-producing frequency band received from block 440 (which in this embodiment is an energy level of the full band of the input audio signal).

The input audio signal is processed with filters and attenuators to attenuate signal in the attenuation frequency band. The input audio signal is filtered by bandpass filter 416 to select the attenuation frequency band from the input audio signal. The output of bandpass filter 416 is modified by attenuation block 220 based on the output from the attenuation factor block 218. A notch filter 418 passes un-modified audio content around the attenuation frequency band to the combiner 232. The combiner 232 recombines the un-modified audio content with an attenuated version of the attenuation frequency band. The output of the combiner 232 is a modified audio signal at output node 404.

Figure 5:
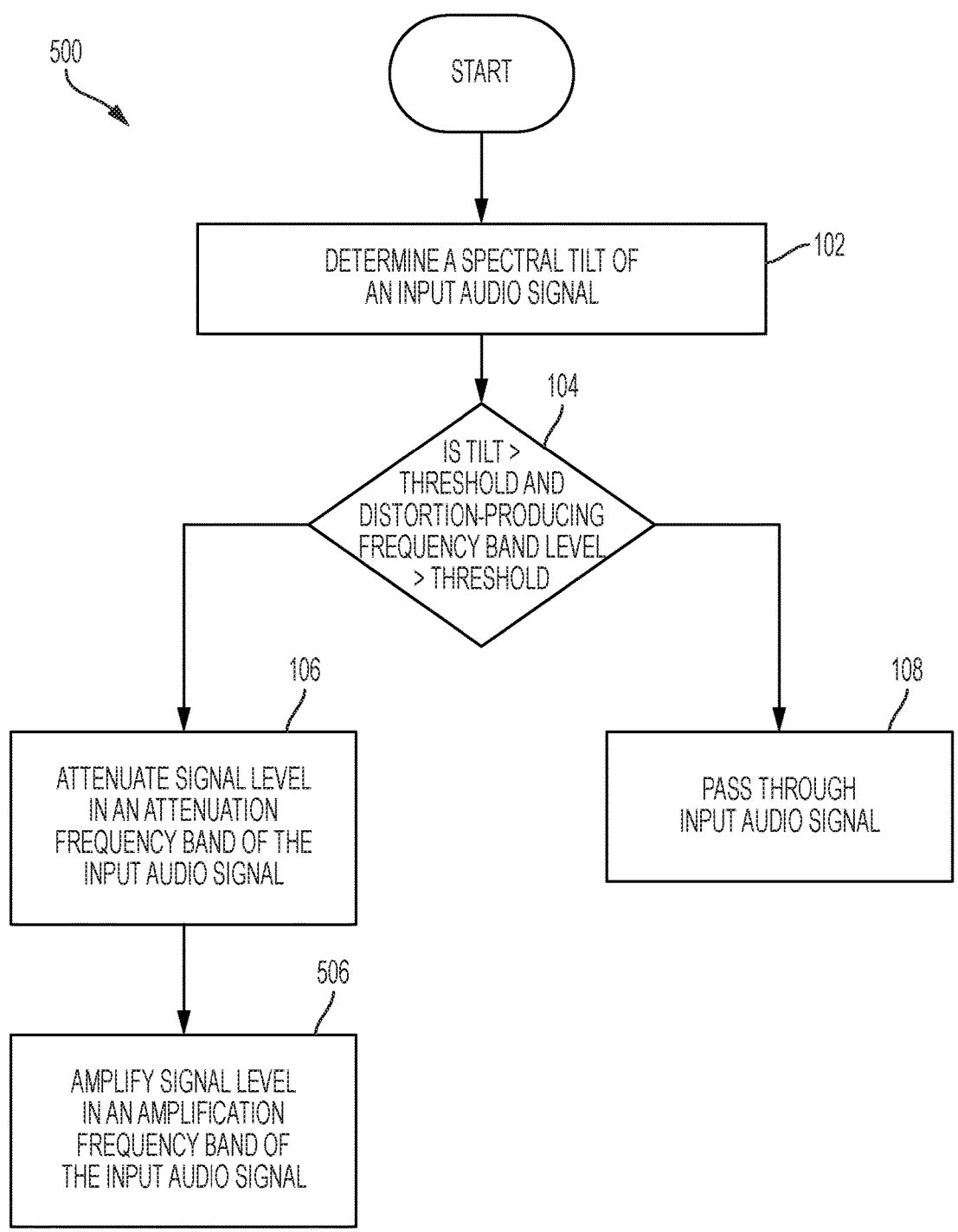
FIG. 5 is a flow chart illustrating an example method of processing an input audio signal to reduce distortion using attenuation and amplification according to some embodiments of the disclosure.

The example embodiments of FIG. 1, FIG. 2A, FIG. 2B, FIG. 3, and FIG. 4, use attenuation of selected frequencies to reduce perceived distortion in reproduced sounds. Amplification of selected frequencies may also be used to reduce perceived distortion in reproduced sounds. A method of using attenuation and amplification to reduce perceived distortion is shown in FIG. 5. FIG. 5 is a flow chart illustrating an example method of processing an input audio signal to reduce perceived distortion using attenuation and amplification according to some embodiments of the disclosure. A method 500 is similar to method 100 of FIG. 1. If conditions at block 104 are satisfied, then an attenuation frequency band is attenuated at block 106. When the spectral tilt is greater than the threshold level indicating that audio distortion will be perceptible and is not sufficiently masked, an amplification frequency band may be amplified at block 506 in addition or in the alternative to the attenuation at block 106. The amplification frequency band may be selected to overlap the distortion-masking frequency band, such that amplification of the amplification frequency band further masks the distortion introduced by the speaker.

Figure 6:
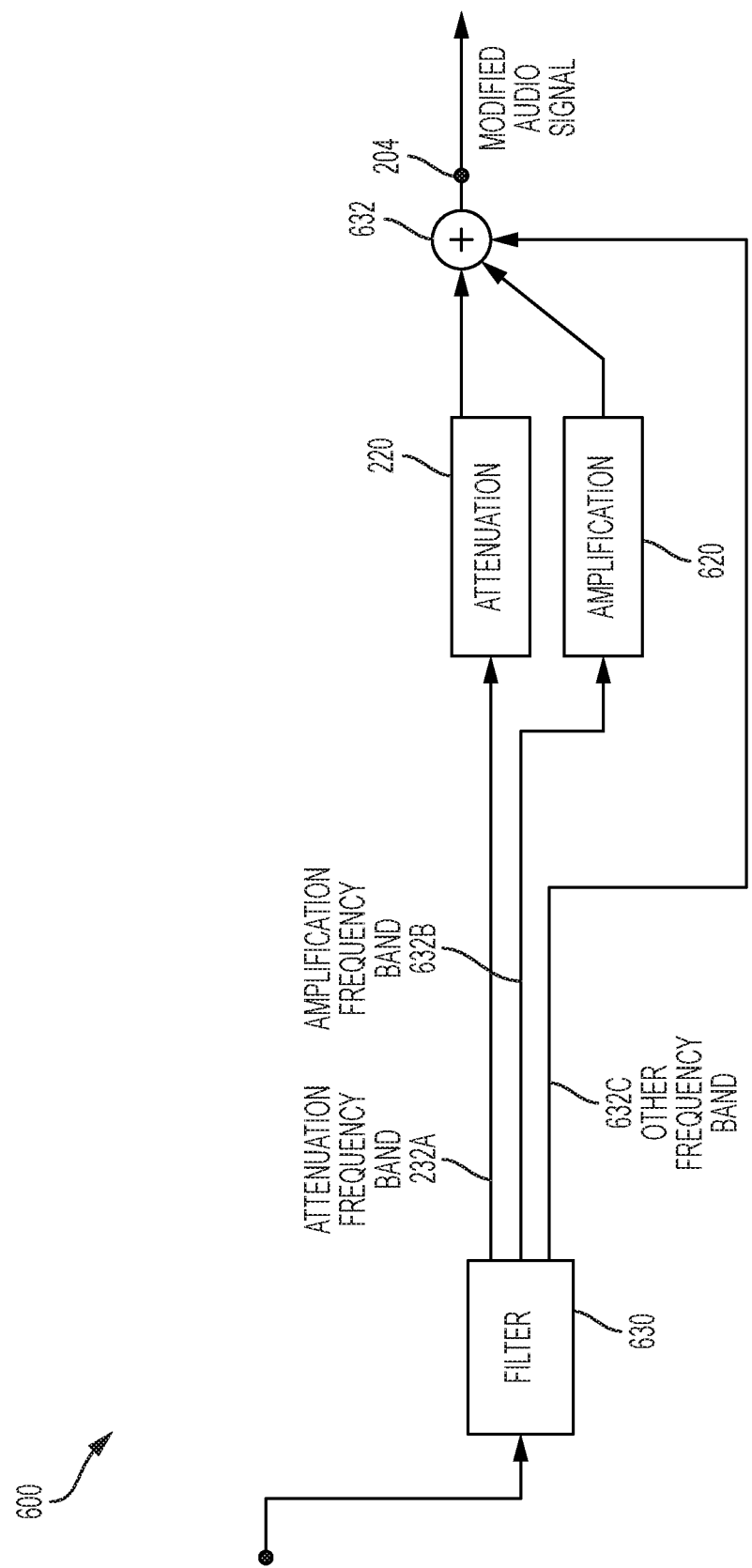
FIG. 6 is a block diagram for an example integrated circuit for processing an input audio signal to reduce distortion using attenuation and amplification according to some embodiments of the disclosure.

An example integrated circuit for performing attenuation and amplification is shown in FIG. 6. FIG. 6 is a block diagram for an example integrated circuit for processing an input audio signal to reduce distortion using attenuation and amplification according to some embodiments of the disclosure. Integrated circuit (IC) 600 is similar to IC 200A and 200B of FIG. 2A and FIG. 2B. FIG. 6 shows a spectral tilt value based on signal levels of the distortion-producing frequency band and the distortion-masking frequency band.

A combination of attenuation and amplification may also be used to modify audio signals when other measures of spectral tilt are used, such as the ratio used in the embodiments of FIG. 4 and FIG. 5.

Referring back to FIG. 6, the modification of the input audio signal begins at block 630. Block 630 filters the input audio signal into an attenuation frequency band 232A, an amplification frequency band 632B, and other frequency bands 632C. The attenuation block 220 operates on attenuation frequency band 232A to reduce a signal level in at least a portion of the frequency band 232A. An amplification block 620 operates on the amplification frequency band 632B to increase a signal level in at least a portion of the frequency band 632B. The amplification block 620 may be controlled by attenuation factor block 218 based on the same parameters used to control attenuation block 220. The output of attenuation block 220 and amplification block 620 are joined with the other frequency bands 632C by combiner 632 to form a modified audio signal for output at output node 204. The attenuation block 220 and amplification block 620 may be separately enabled and disabled based on measured spectral tilt, signal level in a high frequency band, signal level in a distortion-producing frequency band, signal level in a distortion-masking frequency band, and/or other parameters.

Figure 7:
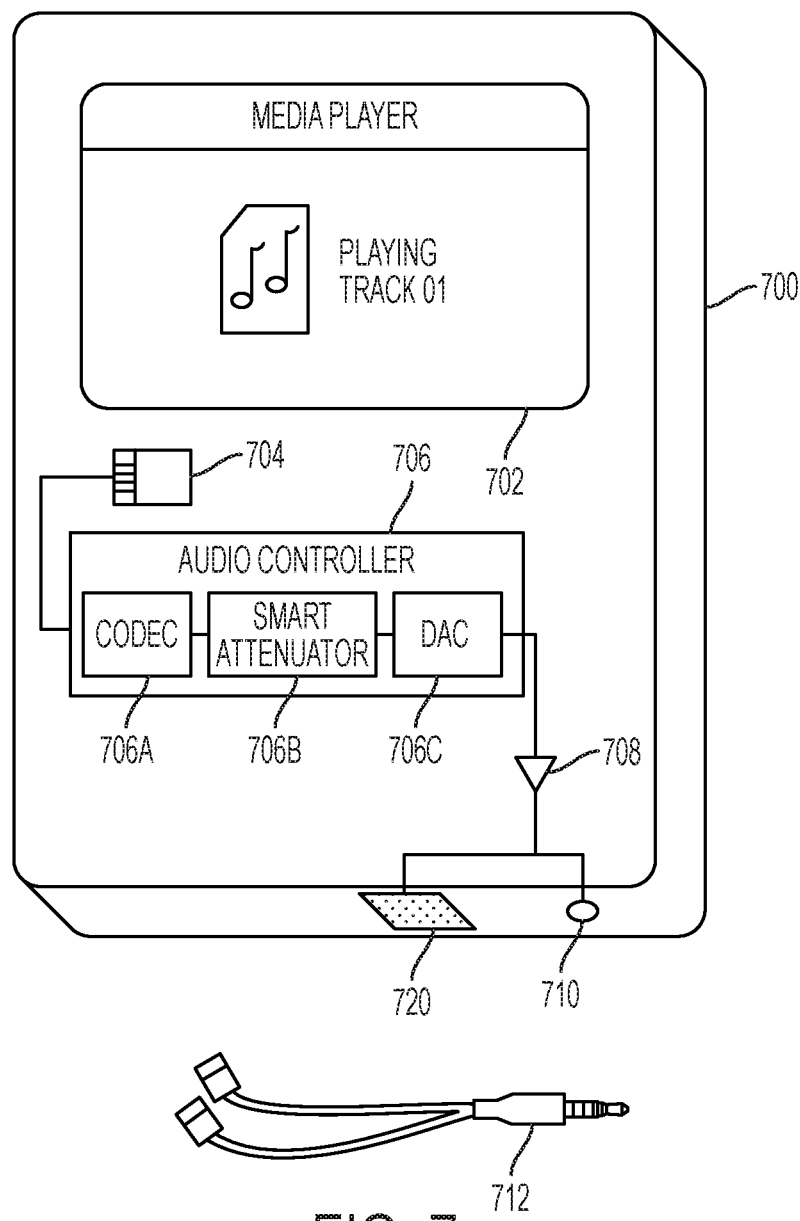
FIG. 7 is an illustration showing an example personal media device for audio playback including an audio controller that is configured to reduce distortion according to some embodiments of the disclosure.

One advantageous embodiment for an audio processor described herein is a personal media device for playing back music, high-fidelity music, and/or speech from telephone calls. FIG. 7 is an illustration showing an example personal media device for audio playback including an audio controller that is configured to reduce distortion in reproduced audio according to one embodiment of the disclosure. A personal media device 700 may include a display 702 for allowing a user to select from music files for playback, which may include both high-fidelity music files and normal music files. When music files are selected by a user, audio files may be retrieved from memory 704 by an application processor (not shown) and provided to an audio controller 706. The audio controller 706 may include a coder/decoder (CODEC) 706A and audio processing circuitry including smart attenuator 706B and DAC 706C. The smart attenuator 706B may implement audio processing to modify an input audio signal, such as according to the embodiments of FIG. 1, FIG. 2A, FIG. 2B, FIG. 3, FIG. 4, FIG. 5, and FIG. 6. The digital audio (e.g., music or speech) may be converted to analog signals by the audio controller 706, and those analog signals amplified by an amplifier 708. Although the smart attenuator 706B is shown operating on the digital signal prior to conversion to an analog signal, the smart attenuator in other embodiments may operate on the analog signal. The amplifier 708 may be coupled to an audio output 710, such as a headphone jack, for driving a transducer, such as headphones 712. The amplifier 708 may also be coupled to an internal speaker 720 of the device 700. When a headphone is connected at audio output 710, the smart attenuator 706B may be disabled because the headphones 712 do not introduce the same distortion as speaker 720. In some embodiments, the smart attenuator 706B is provided an indication of when the headphones 712 are connected at audio output 710 along with an indication of the type of headphones such that the smart attenuator may modify processing to reduce distortions that are specific to the headphones 712. Although the data received at the audio controller 706 is described as received from memory 704, the audio data may also be received from other sources, such as a USB connection, a device connected through Wi-Fi to the personal media device 700, a cellular radio, an Internet-based server, another wireless radio, and/or another wired connection.

The schematic flow chart diagrams of FIG. 1, FIG. 3, and FIG. 5 are generally set forth as a logical flow chart diagram. Likewise, other operations for the circuitry are described without flow charts herein as sequences of ordered steps. The depicted order, labeled steps, and described operations are indicative of aspects of methods of the invention. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general-purpose processor (e.g., CPU or DSP) capable of executing instructions contained in software. The firmware and/or software may include instructions that cause the processing of signals described herein to be performed. The circuitry or software may be organized as blocks that are configured to perform specific functions. Alternatively, some circuitry or software may be organized as shared blocks that can perform several of the described operations. In some embodiments, the integrated circuit (IC) that is the controller may include other functionality. For example, the controller IC may include an audio coder/decoder (CODEC) along with circuitry for performing the functions described herein. Such an IC is one example of an audio controller. Other audio functionality may be additionally or alternatively integrated with the IC circuitry described herein to form an audio controller.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, where general purpose processors are described as implementing certain processing steps, the general purpose processor may be a digital signal processors (DSPs), a graphics processing units (GPUs), a central processing units (CPUs), or other configurable logic circuitry. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for reducing perceived audio distortion in a loudspeaker in response to an input audio signal, the method comprising:
   determining a first signal level of a distortion-producing frequency band of the input audio signal;
   determining a second signal level of a distortion-masking frequency band of the input audio signal; and
   attenuating the signal level in an attenuation frequency band of the input audio signal to produce a modified audio signal based, at least in part, on the signal level of the distortion-producing frequency band and on the signal level of the distortion-masking frequency band.

2. The method of claim 1, wherein the step of attenuating the signal level comprises determining a ratio between the second signal level and the first signal level.

3. The method of claim 2, wherein the distortion-producing frequency band comprises an entire audio spectrum, and wherein the ratio is a ratio of high-frequency energy in the distortion-masking frequency band to all energy in the input audio signal.

4. The method of claim 1, wherein a frequency range of the distortion-producing frequency band is centered at a resonant frequency of the loudspeaker.

5. The method of claim 4, wherein the loudspeaker is a microspeaker with a resonant frequency in the 300 Hz to 1500 Hz range.

6. The method of claim 1, wherein a frequency range of the distortion-masking frequency band is higher in frequency than the frequency range of the distortion-producing frequency band.

7. The method of claim 1, wherein the step of attenuating the signal level comprises determining a spectral tilt of the input audio signal based on the first signal level and the second level, and attenuating the signal level when the spectral tilt is greater than a threshold level.

8. The method of claim 1, wherein the step of attenuating the signal level of the input audio signal comprises the steps of limiting a dynamic range of the input audio signal by performing the steps of:
comparing the first signal level of the distortion-producing frequency band to a limiter threshold level;
attenuating the signal level in the attenuation frequency band when the first signal level of the distortion-producing frequency band is above the limiter threshold level; and
leaving the signal level in the attenuation frequency band unattenuated when the first signal level of the distortion-producing frequency band is below the limiter threshold level.

9. The method of claim 8, wherein the limiter threshold level is based, at least in part, on a ratio of the second signal level in the distortion-masking frequency band to the first signal level in the distortion-producing frequency band.

10. The method of claim 8, further comprising reducing the limiter threshold proportionally to a decrease of a ratio of the second signal level in the distortion-masking frequency band to the first signal level in the distortion-producing frequency band.

11. The method of claim 1, further comprising outputting the attenuated audio signal to the loudspeaker.

12. The method of claim 1, further comprising amplifying a signal level in an amplification frequency band of the modified audio signal to produce an attenuated and amplified audio signal, wherein an amount of amplification in the amplification frequency band is based, at least in part, on an amount of attenuation in the attenuation frequency band.

13. The method of claim 12, wherein the amplification frequency band overlaps the masking frequency band.

14. The method of claim 12, wherein a frequency range of the amplification frequency is higher in frequency than a frequency range of the attenuation frequency band.

15. The method of claim 12, wherein the amount of amplification in the amplification frequency band is inversely proportional to the amount of attenuation in the attenuation frequency band.

16. An apparatus, comprising:
an audio controller configured to perform steps for reducing perceived audio distortion in a loudspeaker in response to an input audio signal comprising:
determining a first signal level of a distortion-producing frequency band of the input audio signal;
determining a second signal level of a distortion-masking frequency band of the input audio signal; and
attenuating the signal level in an attenuation frequency band of the input audio signal to produce a modified audio signal based, at least in part, on the signal level of the distortion-producing frequency band and on the signal level of the distortion-masking frequency band.

17. The apparatus of claim 16, wherein the audio controller is configured to attenuate the signal level by determining a ratio between the second signal level and the first signal level.

18. The apparatus of claim 17, wherein the distortion-producing frequency band comprises an entire audio spectrum, and wherein the ratio is a ratio of high-frequency energy in the distortion-masking frequency band to all energy in the input audio signal.

19. The apparatus of claim 16, wherein the frequency range of the distortion-producing frequency band is centered at a resonant frequency of the loudspeaker.

20. The apparatus of claim 19, wherein the loudspeaker is a micro-speaker with a resonant frequency in the 300 Hz to 1500 Hz range.

21. The apparatus of claim 16, wherein the frequency range of the distortion-masking frequency band is higher in frequency than the frequency range of the distortion-producing frequency band.

22. The apparatus of claim 16, wherein the audio controller is configured to attenuate the signal level by determining a spectral tilt of the input audio signal based on the first signal level and the second level, and configured to attenuate the signal level when the spectral tilt is greater than a threshold level.

23. The apparatus of claim 16, wherein the audio controller is further configured to perform steps comprising limiting a dynamic range of the input audio signal by:
comparing the signal level in the distortion-producing frequency band to a limiter threshold level;
attenuating the signal level in the distortion-producing frequency band when the signal level in the distortion-producing frequency band is above the limiter threshold level; and
leaving the signal level in the distortion-producing frequency band unattenuated when the distortion-producing frequency band is below the limiter threshold level.

24. The apparatus of claim 23, wherein the limiter threshold level is based, at least in part, on a ratio of the signal level in the distortion-masking frequency band to the signal level in the distortion-producing frequency band.

25. The apparatus of claim 16, wherein the audio controller is further configured to perform steps comprising amplifying a signal level in an amplification frequency band of the attenuated input audio signal to produce an attenuated and amplified audio signal, wherein an amount of amplification in the amplification frequency band is based, at least in part, on an amount of attenuation in the attenuation frequency band.

26. The apparatus of claim 25, wherein a frequency range of the amplification frequency is higher in frequency than a frequency range of the attenuation frequency band.

27. The apparatus of claim 25, wherein the amount of amplification in the amplification frequency band is inversely proportional to the amount of attenuation in the attenuation frequency band.

28. An apparatus, comprising:
an input node for receiving an input audio signal;
a spectral tilt computation block configured to calculate a spectral tilt value a representative of a distribution of energy in the input audio signal; and
an attenuation block configured to decrease a signal level in a distortion-producing frequency band of the input audio signal based, at least in part, on the spectral tilt value.

29. The apparatus of claim 28, wherein the spectral tilt computation block is configured to calculate a ratio between a first signal level of a distortion-producing frequency band of the input audio signal and a second signal level of a distortion-masking frequency band of the input audio signal.

30. The apparatus of claim 28, wherein the spectral tilt computation block is configured to calculate a ratio between a first signal level of the input audio signal and a second signal level of a subset of frequencies of the input audio signal, the subset of frequencies being higher in frequency than the distortion-producing frequency band.

31. The apparatus of claim 28, wherein the attenuation block is configured to attenuate the distortion-producing frequency band by limiting a dynamic range of the input audio signal by:
    comparing a signal level in the distortion-producing frequency band to a limiter threshold level;
    attenuating the signal level in the distortion-producing frequency band when the signal level in the distortion-producing frequency band is above the limiter threshold level; and
    leaving the signal level in the distortion-producing frequency band unattenuated when the distortion-producing frequency band is below the limiter threshold level.

32. The apparatus of claim 28, further comprising an amplification block configured to increase a signal level of a distortion-masking frequency band of the input audio signal based, at least in part, on the spectral tilt value.

33. The apparatus of claim 28, further comprising a speaker coupled to an output node and configured to receive a modified audio signal from the attenuation block.

\* \* \* \* \*